United States Patent [19]

Shimogama et al.

[11] Patent Number: 5,757,815
[45] Date of Patent: May 26, 1998

[54] SEMICONDUCTOR MEMORY TEST SYSTEM

[75] Inventors: Kazushige Shimogama, Gyoda; Hiromi Oshima, Saitama, both of Japan

[73] Assignee: Advantest Corp., Tokyo, Japan

[21] Appl. No.: 667,655

[22] Filed: Jun. 21, 1996

[30] Foreign Application Priority Data

Jun. 22, 1995 [JP] Japan .................. 7-179464

[51] Int. Cl.$^6$ .................. G06F 11/00
[52] U.S. Cl. .................. 371/21.1
[58] Field of Search .................. 371/21.1, 21.2, 371/21.3, 21.4, 22.1, 27.1, 40.18

[56] References Cited

U.S. PATENT DOCUMENTS 5,579,251 11/1996 Sato .................. 371/22.1
5,604,756 2/1997 Kawara .................. 371/40

Primary Examiner—Vincent P. Canney
Attorney, Agent, or Firm—Muramatsu & Associates

[57] ABSTRACT

A semiconductor test system facilitates failure analysis of memory devices by being able to switch one situation where expected data used for an address fail memory is the same as data showing charge/discharge states in the memory cells of a memory device under test and another situation where the expected data is the same as data showing the expected output data of the device under test. For doing this, the semiconductor test system includes a prohibit means 7 for prohibiting the output of the an area inversion memory 22 from transferring to later stages, and an exclusive OR gate 6 which receives an output of the prohibit means 7 at one input and an output of an exclusive OR gate 23 at another input. The exclusive OR gate 6 supplies a resulted output to an address fail memory 5.

6 Claims, 5 Drawing Sheets

SEMICONDUCTOR MEMORY TEST SYSTEM

FIELD OF THE INVENTION

This invention relates to a structure of a semiconductor memory test system, and more particularly, to an improved semiconductor memory test system which facilitates failure analysis of a semiconductor memory device under test by having switching means for generating expected data concerning charge/discharge states of internal memory cells of the semiconductor device under test or expected data concerning output states of the semiconductor device under test.

BACKGROUND OF THE INVENTION

In testing a semiconductor memory, a semiconductor memory test system provides, during a write process, write data to a memory device under test, and during a read process, the test system reads the data stored in the memory device under test and compares the read data with expected data produced by the test system. In acquiring the resultant fail information in an address fail memory corresponding to each address of the memory device under test, a semiconductor memory test system has a function of separately storing the fail information when the expected data is "1" from the fail information when the expected data is "0".

As is well known in the art, dynamic random access memories (DRAM) store data based on charge/discharge in condensers formed in the memory cells. Some DRAM devices have a cell structure in which electric charges in the memory cells do not match with data output from the DRAM devices. For example, even when writing the data "1" in all of the cells in the memory, because of the reasons related to physical structures in the memory cells, a half of the memory cells are in a charge state while the remaining memory cells are in a discharge state. Therefore, in testing such a memory device, it is necessary to form a test pattern with the above memory cell structure in mind.

For testing a memory device whose internal charge/discharge states of the memory cells are different from the output data as noted above, a semiconductor memory test system includes an area inversion random memory (ARIRAM) in an algorithmic pattern generator (ALPG) to produce inverted expected data for the specific addresses of the memory device to be tested.

An algorithmic pattern generator is a pattern generator which generates test patterns based on mathematical functions for testing memory devices.

The same assignee of the present invention has developed a semiconductor memory test system which is explained in the following with reference to a block diagram of FIG. 3 and data structures of FIG. 4. It should be noted that the semiconductor memory test system of FIG. 3 is a conventional technology only for the inventor of the present invention but is not known or used in the public domain or described in printed publications at the time of the invention or the filing date.

As shown in FIG. 3, the basic structure of the semiconductor memory test system includes a timing generator (TG) 1, an algorithmic pattern generator 2, a programmable data selector (PDS) 3, a logic comparator 4, an address fail memory (AFM) 5, and an exclusive OR gate 6.

The timing generator 1 generates timing signals which define test rates and test pattern timings used in the semiconductor memory test system.

The algorithmic pattern generator 2 generates a test pattern composed of data and address signals in synchronism with the timing signals from the timing generator 1. The algorithmic pattern generator 2 can invert the logic states of the data signals by the data from an area inversion memory 22 with respect to a specific area of memory cells of the memory device under test. In testing a memory device, data signals that have been used in writing the memory device under test are also used as expected data signals in reading the data in the memory device under test. Thus, the algorithmic pattern generator 2 is able to provide the data D, which is the same data used as the write data, to the logic comparator 4 through the programmable data selector 3.

As an specific example, data A on the line 210 designating the charge/discharge states of memory cells in the memory device under test is shown in FIG. 4(a). Data on the line 220 designating the output of the area inversion memory 22 is shown in FIG. 4 (d), and expected data D designating the expected output data of the memory device is shown in FIG. 4(b), respectively.

The expected data D is provided to the memory device under test 100 through the programmable data selector 3 as write data during the write process of the memory test. In contrast, the expected data D is provided to the logic comparator 4 during the read process of the memory test through the programmable data selector 3 to compare the output data of the memory device under test 100.

Under the foregoing arrangement of FIG. 4, when the expected data D is supplied to the device under test 100 as the write data, the output data of the memory device under test 100, if it functions properly, should show the same data as the expected data D. However, in such a situation, the internal logic (charge/discharge) states in the memory cells of the device under test show the data A (expected data E) of FIG. 4 (a). In other words, the data A showing the internal charge/discharge state of the memory device under test 100 is created by a person who knows the physical structure of the memory device under test based on the write data (expected data D). Further, the data in the area inversion memory 22 is created so as to convert the charge/discharge data A to the write data D by an exclusive OR gate 23 of FIG. 3.

As noted above, in the data read process for the memory device under test 100, the read out data of the device under test 100 shown in FIG. 4(e) is compared with the expected data D shown in FIG. 4(b) by the logic comparator 4 with respect to each pin of the memory device under test 100 to determine whether the memory device 100 functions correctly or not.

In the data read process, the fail information obtained relative to the addresses of the memory device under test 100 by the logic comparator 4 is stored in the address fail memory 5.

Therefore, by reading the data in the address fail memory 5, it is able to determine which address of the memory device under test has failed with respect to the expected data E.

There are two fail modes used in acquiring the fail information in the address fail memory 5. One fail mode FZ is to write "1" in the corresponding address bits of the fail memory 5 when the fails are detected for the expected data "0". The other fail mode FO is to write "1" in the corresponding address bits of the fail memory 5 when the fails are detected for the expected data "1".

As shown in FIG. 3, the expected data E provided to the address fail memory 5 is the same as the expected data A on the line 210, which shows the expected data with respect to the charge/discharge states of the memory cells in the memory device under test 100. This is because the expected data D on the line 230 is converted back to the original data A by an exclusive OR gate 6 based on the data from the area inversion memory 22. Therefore, the expected data E given to the address fail memory 5 is the data showing the charge/discharge state of the memory cells of the memory device under test.

The specific example of data is further explained with reference to FIG. 4. The Expected data E is the same as the data A showing the charge/discharge state in the memory cells and is shown in FIG. 4 (b). The output of the device under test 100 is shown in FIG. 4(e) which is the test results for the write data D. In the address fail memory 5, the fail data based on the fail mode FZ is stored as shown in FIG. 4 (c) in which the fail data acquired when the expected data E is other than "0" is masked. The fail data based on the fail mode FO is stored as shown in FIG. 4(d) in which the fail data detected when the expected data E is other than "1" is masked. Namely, the fail mode FZ for the address fail memory 5 masks the fail data obtained when the expected data E is "1" and the fail mode FO masks the fail data obtained when the expected data E is "0".

As in the foregoing, when using the area inversion memory 22 in the algorithmic pattern generator 2, the expected data D in FIG. 4(a) to be used in the logic comparator 4 is different from the expected data E used for the address fail memory 5. As a result, as shown in FIGS. 4(c) and 4(f), it is not practically possible to determine whether the fail mode of the device under test is the result of mismatch arisen when the expected data D is "0" or "1" because the fail information is retrieved based solely on "0" and "1" of the expected data E.

Therefore, it is an object of the present invention to provide a circuit arrangement which is capable of facilitating failure analysis of memory devices by switching between two situations of expected data to the address fail memory. In one situation, the expected data E used for the address fail memory 5 is the same as the data A showing the charge/discharge state in the memory cells of the memory device under test. In the other situation, the expected data E is the same as the data D showing the expected output data of the device under test.

SUMMARY OF THE INVENTION

FIGS. 1, 2 and 5 show solutions of the problems according to the present invention.

In the configuration of the present invention, the test signal pattern to be supplied to a memory device under test 100 is produced through an exclusive OR gate 23 which is provided with an output of a data pattern generator 21 and an output of an area inversion memory 22. An address fail memory 5 receives the comparison results of the memory device under test 100 from a logic comparator 4. The semiconductor test system configured as above further includes a prohibit means 7 for prohibiting the output of the area inversion memory 22 from transferring to the address fail memory 5. An exclusive OR gate 6 is provided which receives the output of the prohibit means 7 at its one input terminal and the output of the exclusive OR gate 23 at its another input terminal. The output of the exclusive OR gate 6 is given to the address fail memory 5.

Alternatively, the present invention is configured as follows:

A selector means 9 and a register 8 are provided to the semiconductor memory test system for selectively providing either the data same as the output of the data pattern generator 21 or the data output of the exclusive OR gate 23 to the address fail memory 5.

In this arrangements, when the output of the register 8 is set to "1", the data applied to the address fail memory 5 is identical to that of the conventional circuit arrangement in which the expected data E is the same as the data A showing the internal charge/discharge states of the memory cells. In contrast, when the data in the register 8 is set to "0", the expected data E becomes the same as the data D showing the expected data corresponding to the output data of the device under test.

In the foregoing arrangement of the present invention, the semiconductor test system is able to more easily and accurately perform the failure analysis of the memory device under test.

DETAILED DESCRIPTION OF THE PREFERRED EMBODIMENT

A first embodiment of the present invention is described with reference to FIGS. 1 and 2.

Figure 1:
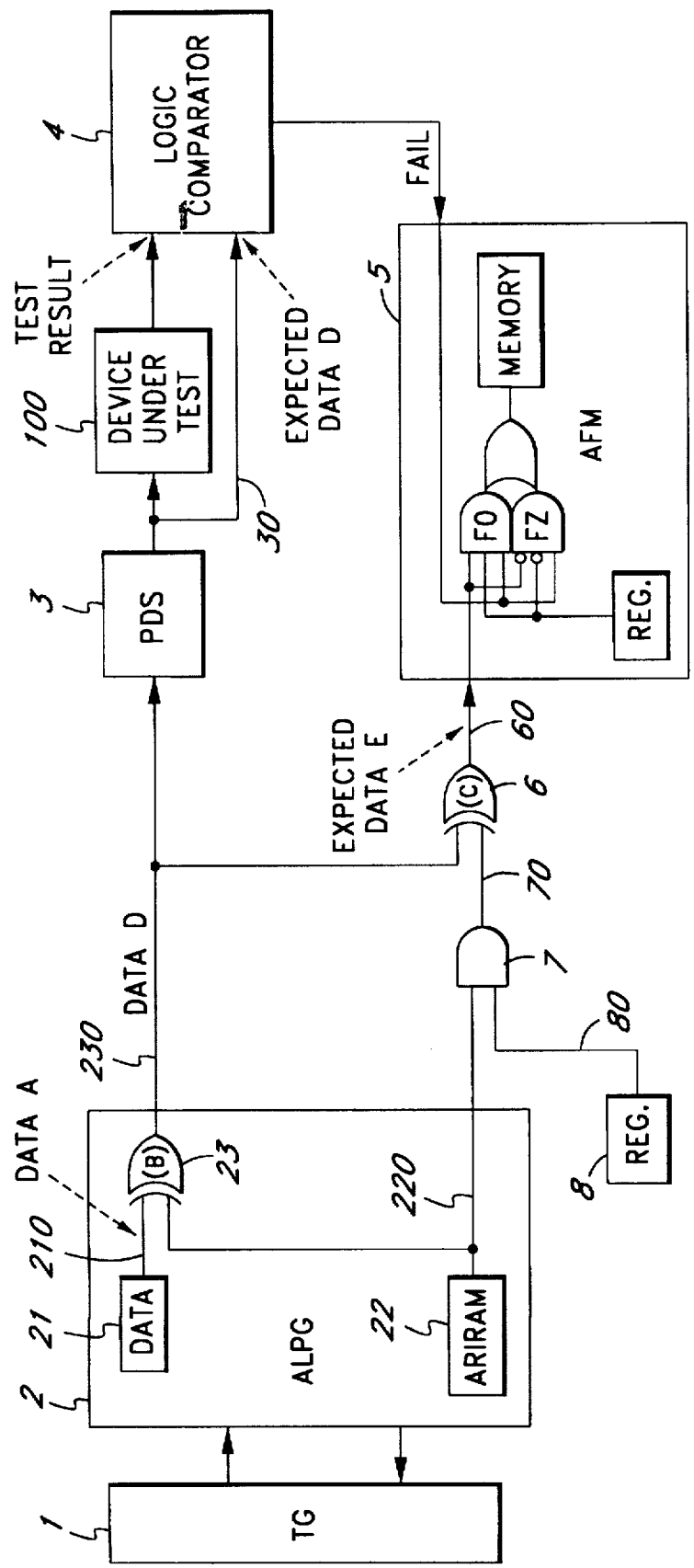
FIG. 1 is a block diagram showing a first embodiment of the present invention.
Figure 2:
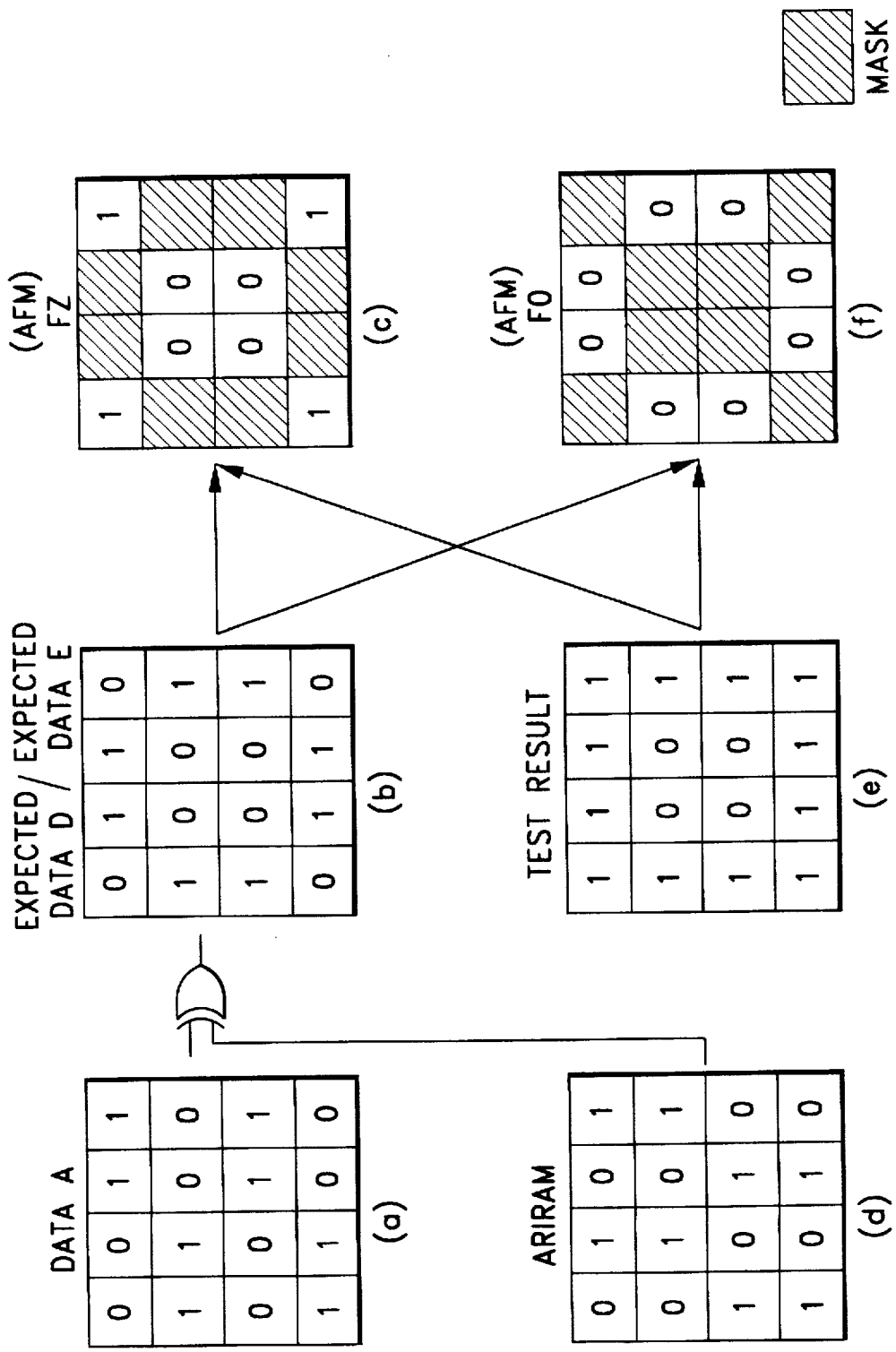
FIG. 2 is a schematic diagram showing relationship between the data in which the expected data corresponding to the charge/discharge state of the internal memory cells is selected.
Figure 3:
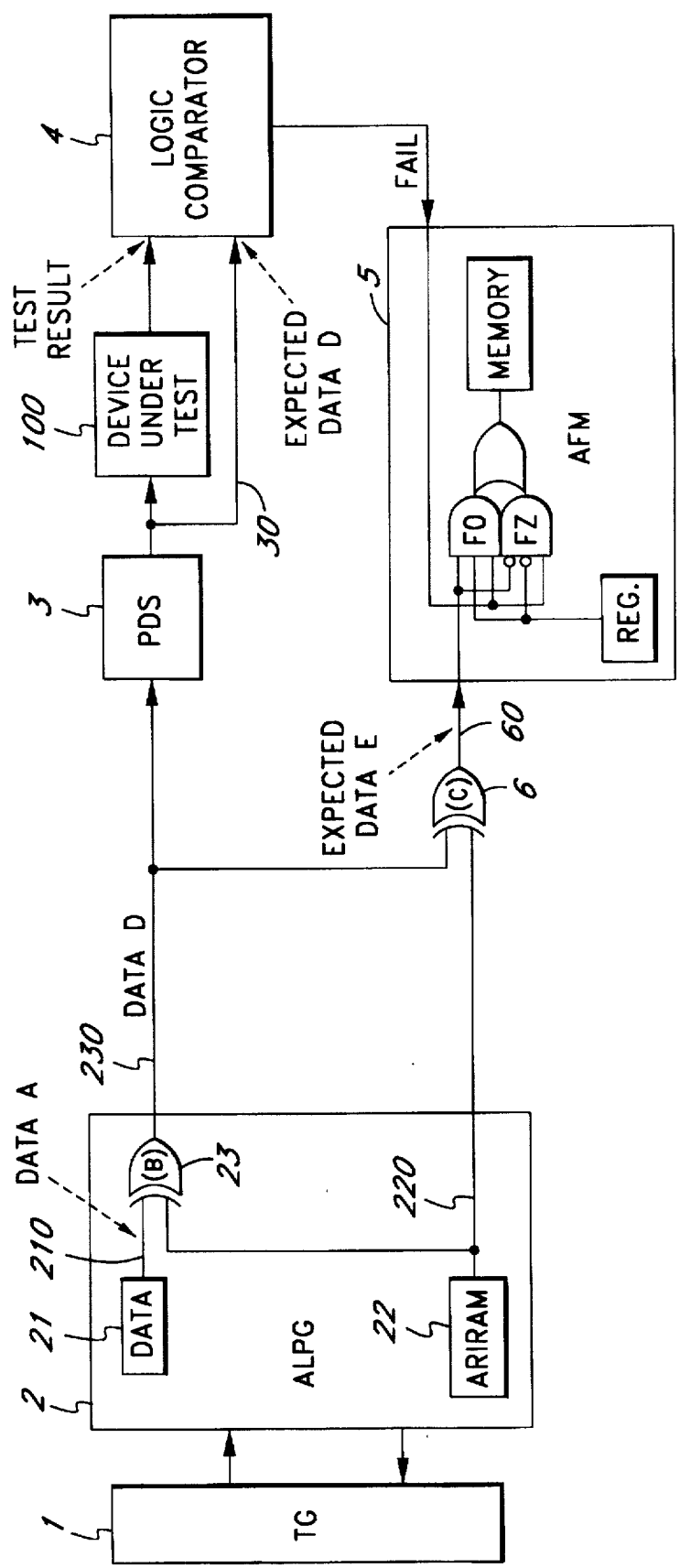
FIG. 3 is a block diagram showing a conventional example of memory test system known to the inventor but not publicly disclosed.

As shown in FIG. 1, the configuration of the semiconductor test system of the present invention is an additional inclusion of a register 8 and an AND gate 7 to the structure of the memory test system shown in FIG. 3 having the timing generator 1, the algorithmic pattern generator 2, the programmable data selector 3, the logic comparator 4, the address fail memory 5 and the exclusive OR gate 6. The algorithmic pattern generator 2 is formed of the data generator 21, the exclusive OR gate 23 and the area inversion memory (ARIRAM) 22.

The AND gate 7 receives an output of the area inversion memory (ARIRAM) 22 provided in the algorithmic pattern generator (ALPG) 2. The exclusive OR function is performed between the data A from the data generator 21 and the output of the area inversion memory 22 by the exclusive OR gate 23 so that the expected data D is provided at the output of the exclusive OR gate 23 on the line 230.

The register 8 controls an ON/OFF operation of the AND gate 7. By setting the output of the register 8 to "1", the data from the area inversion memory 22 and the data D from the exclusive OR gate 23 are provided to the exclusive OR gate 6. Thus, the exclusive OR function is performed between the data D and the data from the area inversion memory 22 by the exclusive OR gate 6 so that the expected data E which is the same as the data A is provided to the address fail memory 5. This situation is the same as the test method in FIGS. 3 and 4.

By setting the output of the register 8 to "0", the AND gate 7 is OFF without regard to the data of the area inversion memory 22. Therefore, in this situation, as shown in FIG. 2 (b), the expected data E to the address fail memory 5 is the same as the expected data D on the line 230. The expected data D is supplied from the programmable data selector 3 to the logic comparator 4 as shown in FIG. 1. Thus, fail modes of the device under test are expressed as shown in FIGS. 2 (c) and 2 (f). Namely, the fail data of the memory device under test detected when the expected data is "0" is shown by the data "1" in the fail mode FZ of the address fail memory 5, and the fail data of the device under test detected when the expected data is "1" is shown by the data "1" in the fail mode FO of the address fail memory 5. Therefore, in this setting, the test is performed based on the expected data corresponding to the device output rather than the internal charge/discharge state of the device.

A second embodiment of the present invention is described with reference to FIGS. 5 and 2.

Figure 4:
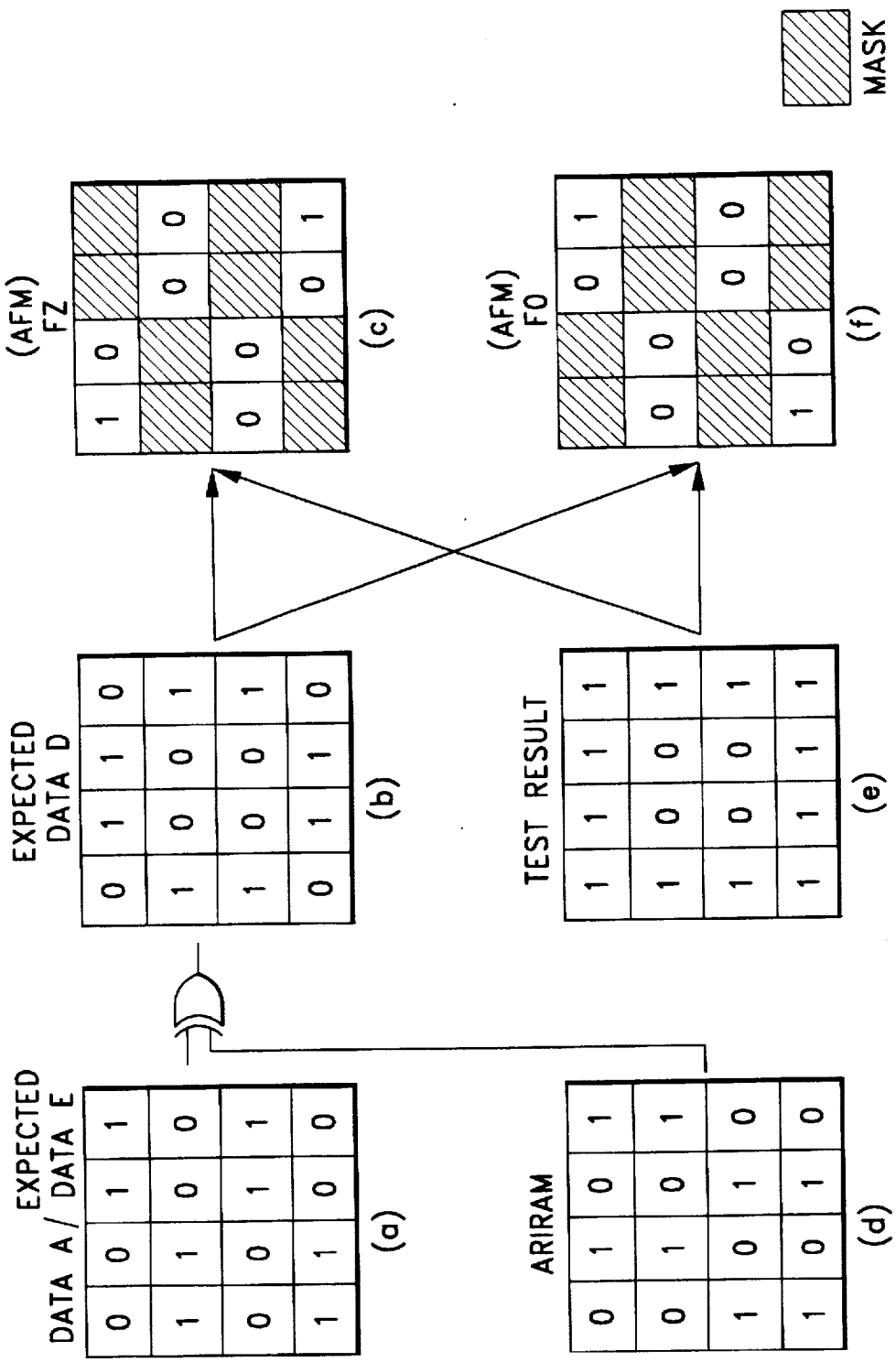
FIG. 4 is a schematic diagram showing relationship between data in the conventional example of FIG. 3.
Figure 5:
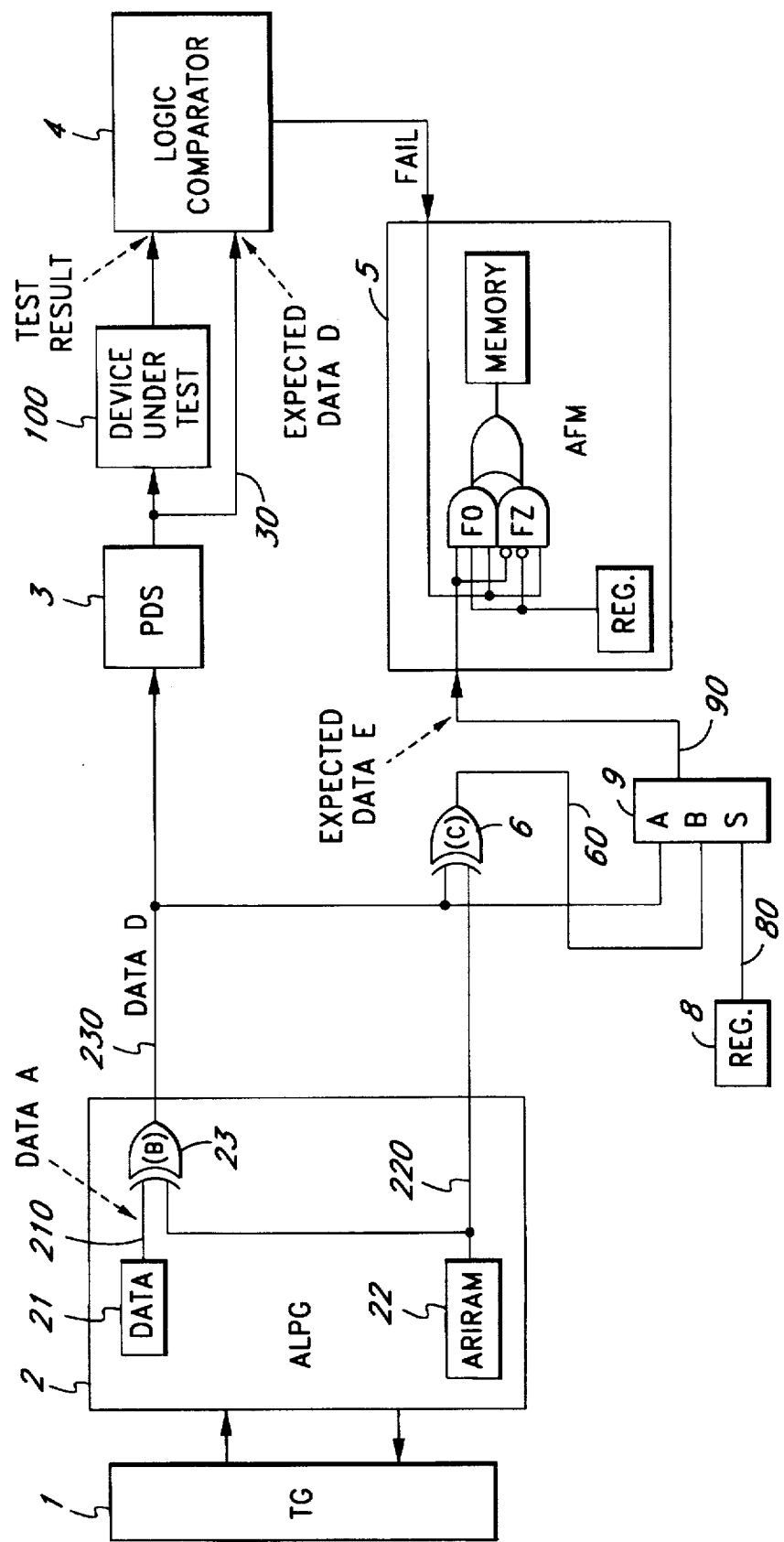
FIG. 5 is a block diagram showing a second embodiment of the present invention.

As shown in FIG. 5, the configuration of the semiconductor test system of the present invention is an additional inclusion of a register 8 and a selector 9 to the structure of the semiconductor test system shown in FIG. 4 having the timing generator 1, the algorithmic pattern generator 2, the programmable data selector 3, the logic comparator 4, the address fail memory and the exclusive OR gate 6.

The selector 9 receives the output of the exclusive OR gate 6 at an input terminal A and the output of the exclusive OR gate 23 in the algorithmic pattern generator 2 at an input terminal B. The output of the register 8 is connected to a select terminal S of the selector 9.

Thus, by setting the output of the register 8 to "1", the selector 9 selects the output of the exclusive OR gate 6 to be supplied to the address fail memory 5. The data D is the result of the exclusive OR function performed by the exclusive OR gate 23 between the data from the area inversion memory 22 and the data A from the data generator 21. The output of the exclusive OR gate 23, i.e., the expected data D, and the data from the area inversion memory 22 are provided to the exclusive OR gate 6. Thus, the data identical to the data A is input to the address fail memory 5 as expected data E. This situation is the same as the test method shown in FIGS. 3 and 4.

By setting the output of the register 8 to "0", the selector 9 selects the output of the exclusive OR gate 23 to be supplied to the address fail memory 5 as the expected data E. Therefore, in this situation, as shown in FIG. 2(b), the expected data E to the address fail memory 5 and the expected data D supplied from the programmable data selector 3 to the logic comparator 4 are identical. Thus, the fail mode of the device under test is expressed as shown in FIGS. 2 (c) and 2 (f). Namely, the fail of the device under test detected when the expected data is "0" is shown by the data "1" in the fail mode FZ of the address fail memory 5, and the fail of the device under test detected when the expected data is "1" is shown by the data "1" in the fail mode FO of the address fail memory 5. Therefore, in this setting, the test is performed based on the expected data corresponding to the device output rather than the internal charge/discharge state of the device.

As a third embodiment, the semiconductor memory test system can be configured as follows.

In the second embodiment noted above, the input terminal B of the selector 9 is provided with the output of the exclusive OR gate 6.

The output data A of the data generator 21 in the algorithmic pattern generator 2 is logically the same as the output of the exclusive OR gate 6.

Therefore, instead of the output of the exclusive OR gate 6, the input terminal B of the selector 9 may be directly provided with the output of the data generator 21 in the algorithmic pattern generator 2.

Since each of the embodiments of the present invention is configured as described above, the present invention attains the following effects.

In the above arrangements, when data in a register 8 is set to "1", the data applied to the address fail memory is identical to that of the conventional circuit arrangement in which the expected data E is the same as the data A showing the charge/discharge states of the memory cells. In contrast, when the data in the register 8 is set to "0", the expected data E becomes the same as the data D showing the expected data of the output data of the memory device under test. In the foregoing arrangement, the semiconductor test system of the present invention is able to more easily perform the fail analysis of the memory device under test.

What is claimed is:

1. A semiconductor memory test system for testing a memory device whose charge/discharge states in memory cells are different from data output therefrom; comprising:

a data generator for generating data indicating charge/discharge states in memory cells in a memory device under test;

means for inverting a predetermined portion of said data generated by said data generator; said inverted data being supplied to said memory device under test during a write process and to a logic comparator during a read process;

an address fail memory for storing fail information on said memory device under test from said logic comparator with respect to logic "1" or logic "0" of expected data supplied thereto; and means for selecting either said data generated by said data generator or said inverted data from said inverting means as said expected data to said address fail memory.

2. A semiconductor memory test system as defined in claim 1, wherein said selecting means formed with a register and an AND gate where output data from said register controls ON/OFF operations of said AND gate.

3. A semiconductor memory test system as defined in claim 1, wherein said selecting means formed with a register and a selector where output data from said register is provided to a select terminal of said selector to select one out of two data inputs to said selector.

4. A semiconductor memory test system as defined in claim 1, wherein said inverting means formed with an area inversion memory for generating data indicating said predetermined portion of said data to be inverted and an exclusive OR gate for performing an exclusive OR function between said data from said data generator and said data from said area inversion memory.

5. A semiconductor memory test system as defined in claim 1, further includes second means for inverting said inverted data from said inverting means to form data identical to said data generated by said data generator.

6. A semiconductor memory test system as defined in claim 5, wherein said second inverting means is formed with an area inversion memory for providing data indicating said predetermined portion of said data to be inverted and an exclusive OR gate for performing an exclusive OR function between said inverted data from said inverting means and said data from said area inversion memory.

* * * * *